United States Patent [19]

Toyoda et al.

[11] 4,417,326

[45] Nov. 22, 1983

[54] STATIC SEMICONDUCTOR MEMORY DEVICE

[75] Inventors: Kazuhiro Toyoda, Yokohama; Yasuhisa Sugo, Tokyo, both of Japan

[73] Assignee: Fujitsu Limited, Kawasaki, Japan

[21] Appl. No.: 325,381

[22] Filed: Nov. 27, 1981

[30] Foreign Application Priority Data

Nov. 28, 1980 [JP] Japan .............................. 55-167472

[51] Int. Cl.³ .............................................. G11C 7/00
[52] U.S. Cl. .................................... 365/190; 365/189
[58] Field of Search ............................... 365/189, 190

[56] References Cited

U.S. PATENT DOCUMENTS

| | | | |
|---|---|---|---|
| 3,727,188 | 4/1973 | Horsten | 365/189 |
| 3,942,160 | 3/1976 | Yu | 365/189 |
| 4,357,687 | 11/1982 | Rufford | 365/189 |

OTHER PUBLICATIONS

IBM Technical Disclosure Bulletin, vol. 14, No. 6, Nov, 1971, pp. 1734–1735.
Di-istor Speed-Up Word Drive with Resistor Word Bottom, F. Blount et al.

Primary Examiner—George G. Stellar
Attorney, Agent, or Firm—Staas & Halsey

[57] ABSTRACT

A static semiconductor memory device comprises memory cells arranged in a matrix having columns and rows, and bit selection circuits provided in the respective columns. Each of the bit selection circuits is adapted to receive a column selection signal, having a high reference potential, when the corresponding column is selected for supplying a current to the selected column. A discharge path is provided in each bit selection circuit so that the potential of the column selection signal is rapidly lowered when the column is switched from a selected state to a nonselected state, whereby the power consumption is lowered and high speed operation is achieved.

6 Claims, 8 Drawing Figures

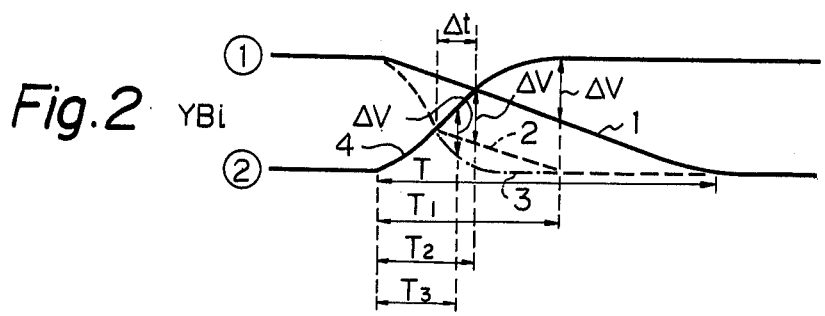

STATIC SEMICONDUCTOR MEMORY DEVICE

BACKGROUND OF THE INVENTION

(1) Field of the Invention

The present invention relates to a static semiconductor memory device having memory cells arranged in a matrix, each memory cell comprising two driving transistors connected in intersection, and more particularly to a semiconductor memory device having a bit line selection circuit in each column for receiving a high potential selection signal when selected and for supplying a current to the selected column; in which a discharge path is provided in each bit line selection circuit for rapidly lowering the potential of the selection signal during the transition from a selected state to a nonselected state, whereby the power consumption is reduced and high speed operation is realized.

(2) Description of the Prior Art

In recent years, semiconductor memory devices, especially static RAMs (random access memories) have greatly progressed in high integration, high speed operation, and low power consumption. The development of large memory capacities, however, has led to the demand for even higher speed operation and lower power consumption.

FIG. 1A is a circuit diagram illustrating a main portion of a conventional static bipolar RAM. In FIG. 1A, $MC_{11}$, $MC_{1n}$, $MC_{mn}$, . . . represent memory cells arranged in a matrix having n columns $C_1$ through $C_n$ and m rows $R_1$ through $R_m$.

FIG. 1B is a circuit diagram illustrating the memory cell $MC_{11}$ in detail. In FIG. 1B, the memory cell $MC_{11}$ consists of two driving transistors $Q_{11}$ and $Q_{12}$ and two memory storage transistors $Q_{21}$ and $Q_{22}$. The driving transistor $Q_{11}$ and the memory storage transistor $Q_{21}$ constitute a multi-emitter transistor. Similarly, the transistors $Q_{12}$ and $Q_{22}$ constitute another multi-emitter transistor. The collector of the transistor $Q_{11}$ is connected to the base of the transistor $Q_{12}$. Similarly, the collector of the transistor $Q_{12}$ is connected to the base of the transistor $Q_{11}$. Thus, the collectors of the transistors $Q_{11}$ and $Q_{12}$ are connected in intersection with each other. The emitters of the memory storage transistors $Q_{21}$ and $Q_{22}$ are commonly connected to a negative word line $WD_1$. Load resistors $R_{11}$ and $R_{12}$ are respectively connected between the collectors of the transistors $Q_{11}$ and $Q_{12}$ and a positive word line $WD_1{}^+$. Load diodes $D_1$ and $D_2$ are respectively connected between the collectors of the transistors $Q_{11}$ and $Q_{12}$ and the positive word line $WD_1{}^+$. When this memory cell $MC_{11}$ is selected, only one of the diodes $D_1$ and $D_2$ conducts current so as to supply a collector current to one of the memory storage transistors $Q_{21}$ and $Q_{22}$. Thus, the load diodes $D_1$ and $D_2$ contribute to saving power consumption.

The other memory cells have a similar configuration to the memory cell $MC_{11}$.

Referring back to FIG. 1A, $WD_1{}^+$, . . . , and $WD_m{}^+$ represent positive word lines connected to the emitters of word driving transistors $TW_1$, . . . , and $TW_m$, respectively. The bases of the word driving transistors $TW_1$, . . . , and $TW_m$ are adapted to receive word selection signals $X_1$, . . . , and $X_m$, respectively. The collectors of the transistors $TW_1$, . . . , and $TW_m$ are grounded. $WD_1{}^-$, . . . , and $WD_m{}^-$ represent negative word lines, each of which is commonly connected to the emitters of the memory storage transistors, included in the corresponding row, and also to a holding current source (not shown).

$(B_{11}, B_{12})$, . . . , and $(B_{n1}, B_{n2})$ each represents a pair of bit lines connected to the emitters of the driving transistors $Q_{11}$, $Q_{12}$, . . . in the corresponding column. The bit lines $B_{11}$, $B_{12}$, . . . , $B_{n1}$, and $B_{n2}$ are connected to the emitters of transistors $TR_{11}$, $TR_{12}$, . . . , $TR_{n1}$, and $TR_{n2}$, respectively. The bases of the transistors $TR_{11}$, $TR_{12}$, . . . , $TR_{n1}$ and $TR_{n2}$ are adapted to receive a signal of a reference potential for a reading operation. The signal of the reference potential is supplied from a reference potential setting circuit RC. The collectors of the transistors $TR_{11}$, $TR_{12}$, . . . , $TR_{n1}$ and $TR_{n2}$ are grounded. $PSA_1$, . . . , and $PSA_n$ are pre-sense amplifiers each consisting of a pair of transistors $(T_{71}, T_{81})$, . . . , or $(T_{7n}, T_{8n})$, respectively. The bases of the transistors $T_{71}$, $T_{81}$, . . . , $T_{7n}$, and $T_{8n}$ are connected to the bit lines $B_{11}$, $B_{12}$, . . . , $B_{n1}$, and $B_{n2}$, respectively. The collectors of the transistors $T_{7n}$, and $T_{8n}$, . . . , $Q_{7n}$, and $Q_{8n}$ are commonly connected to a sense amplifier SA. $PLP_1$, . . . , and $PLP_n$ represent pull-up circuits for charging up the nonselected bit lines, respectively. Each pull-up circuit comprises a multi-emitter transistor $T_{61}$, . . . or $T_{6n}$ with the first emitter being connected to one of the corresponding pair of bit lines and the second emitter being connected to the other of the bit lines.

$BD_1$, . . . , and $BD_n$ represent bit driver circuits. The bit driver circuit $BD_1$ comprises a transistor $T_{11}$, a diode $DI_1$, and a current source $IB_1$. The emitter of the transistor $T_{11}$ is connected to the anode of the diode $DI_1$. The cathode of the diode $DI_1$ is connected to the current source $IB_1$. The collector of the transistor $T_{11}$ is grounded. The base of the transistor $T_{11}$ is connected to a terminal $Y_1$ which is adapted to receive a column selection signal. The other bit driver circuits have a circuit configuration similar to the bit driver circuit $BD_1$.

$BSW_1$, . . . , and $BSW_n$ represent bit selection circuits. The bit selection circuit $BSW_i$ consits of four transistors $T_{2i}$, $T_{3i}$, $T_{4i}$, and $T_{5i}$, where i represents the column number. The collector of the transistor $T_{2i}$ is connected to the bit line $B_{i1}$. The collector of the transistor $T_{5i}$ is connected to the bit line $B_{i2}$. The collector of the transistor $T_{3i}$ is connected to the coupled emitters of the transistors $T_{7i}$ and $T_{8i}$. The collector of the transistor $T_{4i}$ is connected to the base of the pull-up transistor $T_{6i}$. The emitters of the transistors $T_{2i}$ through $T_{5i}$ are connected through signal lines $K_2$, $K_3$, $K_4$, and $K_5$ to current sources $I_2$, $I_3$, $I_4$, and $I_5$, respectively. The bases of the transistors $T_{2i}$, $T_{3i}$, $T_{4i}$, and $T_{5i}$ are commonly connected to a node $YB_i$ connected to the cathode of the diode $DI_i$. Thus, the transistors $T_{21}$, $T_{22}$, . . . , and $T_{2n}$ constitute a current switch. Similarly, the other sets of transistors $T_{31}$ through $T_{3n}$, $T_{41}$ through $T_{4n}$, and $T_{51}$ through $T_{5n}$ constitute current switches, respectively. When one of the columns $C_i$ is selected, a high potential column selecting signal is applied through the terminal $Y_i$ to the bases of the transistors $T_{2i}$ through $T_{5i}$ in the corresponding bit selection circuit $BSW_i$ so that these transistors are turned on to supply currents to the column $C_i$.

The operation of the conventional static bipolar RAM of FIG. 1 will now be briefly described. Assume that information is stored in the memory cell $MC_{11}$ in a state that the transistor $Q_{21}$ is in a conductive state and the transistor $Q_{22}$ is in a cut-off state. In this state, the potential $V_{c1}$ at the collector of the transistor $Q_{11}$ (see FIG. 1B) is at a low potential (hereinafter referred to as an "L level"), and the potential $V_{c2}$ at the collector of the transistor $Q_{12}$ is at a high potential (hereinafter referred to as a "H level"). When the memory cell $MC_{11}$ is selected by applying the H level signals to a terminal $X_1$ connected to the base of the transistor $TW_1$ and to the terminal $Y_1$ connected to the base of the transistor $T_{11}$, respectively, the transistor $TW_1$ is turned on so that the positive word line $WD_1^+$ is caused to be the H level, and, simultaneously, the transistor $T_{11}$ is turned on so that the node $YB_1$ is caused to be the H level. The other terminals $Y_2, \ldots,$ and $Y_n$ are all at the L level so that the nodes $YB_2, \ldots,$ and $YB_n$ are at the L level. Accordingly, only the transistors $T_{21}, T_{31}, T_{41},$ and $T_{51}$ is the selected bit selection circuit $BSW_1$ are turned on to supply currents from the current sources $I_2, I_3, I_4,$ and $I_5$ to the selected column $C_1$.

The emitter of the transistor $TR_{11}$ for setting the reading reference potential and the emitters of the driving transistors $Q_{11}$ in the memory cells $MC_{11}, \ldots,$ and $MC_{m1}$ are connected to the bit line $B_{11}$ to which the current $I_2$ is supplied when the transistor $T_{21}$ is turned on. Also, the emitter of the transistor $TR_{12}$ for setting the reading reference potential and the emitters of the driving transistors $Q_{12}$ in the memory cells $MC_{11}, \ldots,$ and $MC_{m1}$ are connected to the bit line $B_{12}$ to which the current $I_5$ is supplied when the transistor $T_{51}$ is turned on. In the memory cell $MC_{11}$, when the positive word line $WD_1^+$ is raised to the H level so that the potential difference between the positive word line $WD_1^+$ and the node $V_{c1}$ exceeds the threshold voltage of the diode $D_1$, the diode $D_1$ begins to conduct current because the node $V_{c1}$ was at the L level. In contrast, the diode $D_2$ is kept in the cut-off state because the node $V_{c2}$ was at the H level. When the memory cell $MC_{11}$ has been selected, the potential at the nodes $V_{c1}$ and $V_{c2}$ become higher than those when the memory cell $MC_{11}$ is not selected. Also, the potential difference between the nodes $V_{c1}$ and $V_{c2}$ is increased. Then, the reading reference potential setting circuit RC provides an intermediate potential between the voltages $V_{c1}$ and $V_{c2}$ to the bases of the transistors $TR_{11}, TR_{12}, \ldots, TR_{n1},$ and $TR_{n2}$. Because the base potential of the transistor $Q_{11}$ is $V_{c2}$, which is higher than the base potential of the transistor $TR_{11}$, the current switch constituted by the transistors $TR_{11}$ and $Q_{11}$ is operated to cause the transistor $Q_{11}$ to be turned on, while the transistor $TR_{11}$ is kept in the cut-off state. Also, because the base potential of the transistor $Q_{12}$ is $V_{c1}$, which is lower than the base potential of the transistor $TR_{12}$, the current switch constituted by the transistors $TR_{12}$ and $Q_{12}$ is operated to cause the transistor $TR_{12}$ to be turned on, while the transistor $Q_{12}$ is kept in the cut-off state. Thus, the transistor $Q_{11}$ conducts a current from the positive word line $WD_1^+$ to the bit line $B_{11}$, and the transistor $TR_{12}$ conducts current to the bit line $B_{12}$. The potential difference between the bit lines $B_{11}$ and $B_{12}$ is amplified by the pre-sense amplifier $PSA_1$ which consists of the transistors $T_{71}$ and $T_{81}$ having emitters commonly connected through the transistor $T_{31}$ to the current source $I_3$ to form a current switch. The amplified signal obtained between the collectors of the transistors $T_{71}$ and $T_{81}$ is further amplified by the sense amplifier SA.

In order to avoid unnecessary writing in the half-selected memory cells $MC_{12}, \ldots,$ and $MC_{1n}$, the driving transistors in these half-selected memory cells must be completely turned off. For this purpose, the pull-up circuits $PLP_2, \ldots, PLP_n$ operate so that the transistors $T_{62}, \ldots,$ and $T_{6n}$ included therein are turned on. Thus, the transistors $T_{42}, \ldots,$ and $T_{4n}$ are cut off, and, therefore, the bases of the transistors $T_{62}, \ldots,$ and $T_{6n}$ are at the H level. Thus, the bit lines $B_{21}, B_{22}, \ldots, B_{n1},$ and $B_{n2}$ are charged up to the H level by the power supply line $V_{cc}$ through respective transistors $T_{62}, \ldots,$ and $T_{6n}$. This ensures the cut-off states of the driving transistors in the memory cells $MC_{12}, \ldots,$ and $MC_{1n}$.

The problem in the conventional static bipolar RAM of FIG. 1A will now be described. Referring to the bit selection circuit $BSW_i$ (i=1, 2, ..., or n), when one column $C_i$ is selected, a column selection signal is applied to the node $YB_i$ commonly connected to the bases of the transistors $T_{2i}, T_{3i}, T_{4i},$ and $T_{5i}$ in the bit selection circuit. When the column changes its state from a nonselected state to a selected state, the column selection signal rises from the L level to the H level. When the column changes its state from a selected state to a nonselected state, the column selection signal falls from the H level to the L level. In the conventional memory, there is a disadvantage in that the falling speed of the potential at the node $YB_i$ is low, so that the switching speed of the columns is low.

More specifically, the bit driver circuit $BD_i$ provided in each column comprises an emitter follower transistor $T_{1i}$, a level shifting diode $DI_i$, and a level shifting current source $IB_i$. When the potential at the terminal $Y_i$ is at the H level, the transistor $T_{1i}$ turns on to cause the node $YB_i$ to be at the H level. When the terminal $Y_i$ is at the L level, the transistor $T_{1i}$ turns off so that the node $YB_i$ goes to the L level. The H level at the node $YB_i$ is set by the transistor $T_{1i}$ and the diode $DI_i$ to a predetermined level lower than the potential at the collector of the transistor $T_{2i}, T_{3i}, T_{4i},$ or $T_{5i}$, so that the transistors $T_{2i}, T_{3i}, T_{4i},$ and $T_{5i}$ are not saturated. The bases of the transistors $T_{2i}, T_{3i}, T_{4i},$ and $T_{5i}$, the junction portion of the diode $DI_i$, and the wiring line for these bases have a parasitic capacitance $CB_i$. When the column $C_i$ changes its state from a selected state to a nonselected state, the transistor $T_{1i}$ is turned off so that the potential at the node $YB_i$ falls. During the fall of the potential at the node $YB_i$, the charges stored in the parasitic capacitance $CB_i$ should be discharged. Recent technology has increased memory capacities more and more with a corresponding increase in the number of the columns. The increase in the number of columns has been accompanied by an increase in the number of the current sources $IB_i$ as well, so that the power consumption tends to be increased. Also, the lengths of the wiring lines tend to become longer, so that the parasitic capacitance tends to increase. In order to suppress the increase in the power consumption, the value of the current source $IB_i$ should be as small as possible. However, the smaller the value of the current source $IB_i$, the longer the time required for discharging the parasitic capacitance $CB_i$. Accordingly, the falling speed of the potential at the node $YB_i$ becomes low.

FIG. 2 is a time chart illustrating the changes of the potentials of the bit lines. In FIG. 2, ① represents a curve of the potential at the node $YB_i$ when the column $C_i$ changes from its selected state to the nonselected state. As can be seen from the curve ①, the falling time T is too long. A curve ② is the curve of the potential at the node $YB_i$ when the column changes from its nonselected state to the selected state. As can be seen from the curve ②, the rising time $T_1$ is relatively small regardless of the value of the current $IB_i$ because the emitter-follower transistor $T_{1i}$ forces the node $YB_i$ to be driven to the H level. In a reading operation, the sense amplifier SA can detect, through the pre-sense amplifier, the potential difference between the bit lines $B_{i1}$ and $B_{i2}$ only after the potential difference between the curves ① and ② exceeds a predetermined value $\Delta V$. Therefore, the falling speed of the potential at the node $YB_i$ directly affects the access time of the memory.

The above-mentioned problem becomes more and more serious with the increase in the memory capacity, because the value of the current source $IB_i$ must be increasingly minimized so as to save on power consumption, along with the increase in the number of columns.

SUMMARY OF THE INVENTION

It is an object of the present invention to provide a static semiconductor memory device which overcomes the above-described disadvantages of the conventional memory.

An object of the present invention is to provide a static semiconductor memory device in which high speed operation is realized by decreasing the fall time of the potential at the node $YB_i$ and in which low power consumption is realized by decreasing the value of the current source $IB_i$.

According to the present invention, there is provided a static semiconductor memory device comprising: a plurality of memory cells arranged in a matrix having columns and rows, each memory cell comprising two driving transistors connected in intersection; a plurality of word lines connected to the memory cells and arranged in the row direction; a plurality of bit lines connected to the memory cells and arranged in the column direction, each bit line being adapted to receive a current for reading information stored in or for writing information to be stored in the memory cells; a plurality of bit selection circuits provided in the columns, respectively, each of the bit selection circuits being adapted to receive a column selection signal having a high (or low) reference potential, when the corresponding column is selected, for supplying a current from a common current source to the selected column; and a plurality of bit driver circuits provided in the columns, respectively. Each of the bit driver circuits is adapted to cause the column selection signal to have the high (or low) reference potential when the corresponding column is selected. The static semiconductor memory device further comprises: a discharge current source; a plurality of discharge paths, each of the discharge paths being connected between one of the bit selection circuits and the discharge current source, whereby, when a column is switched from a selected state to a nonselected state, the potential of the column selection signal is lowered (or highered) through the discharge path.

It is preferable that each of the bit selection circuits comprises a transistor having an emitter connected to the common current source, a base being adapted to receive the column selection signal, and a collector connected to the corresponding column, whereby all of the transistors included in the respective bit selection circuits constitutes a current switch. One end of each of the discharge paths is connected to the base of the transistor in the corresponding bit selection circuit.

It is also preferable that each of the discharge paths comprises a discharge diode having an anode connected to the base of the transistor in the corresponding bit selection circuit and a cathode connected to the common current source.

It is further preferable that each of the discharge paths comprises a delay circuit and a discharge transistor having a collector connected to the base of the transistor in the corresponding bit selection circuit, an emitter connected to the common current source, and a base adapted to receive the column selection signal through the delay circuit.

BRIEF DESCRIPTION OF THE DRAWINGS

The foregoing objects and other objects as well as characteristic features of the invention will become more apparent and more readily understandable by the following description when read in conjunction with the accompanying drawings, in which like reference characters designate the same or similar parts throughout the figures thereof and wherein:

FIG. 2 is a graph of the changes of the potentials of the bit lines, in the conventional example, and according to the present invention;

FIG. 3 is a circuit diagram of a static bipolar RAM, according to the present invention;

DESCRIPTION OF THE PREFERRED EMBODIMENTS

Figures 1A, 1B:
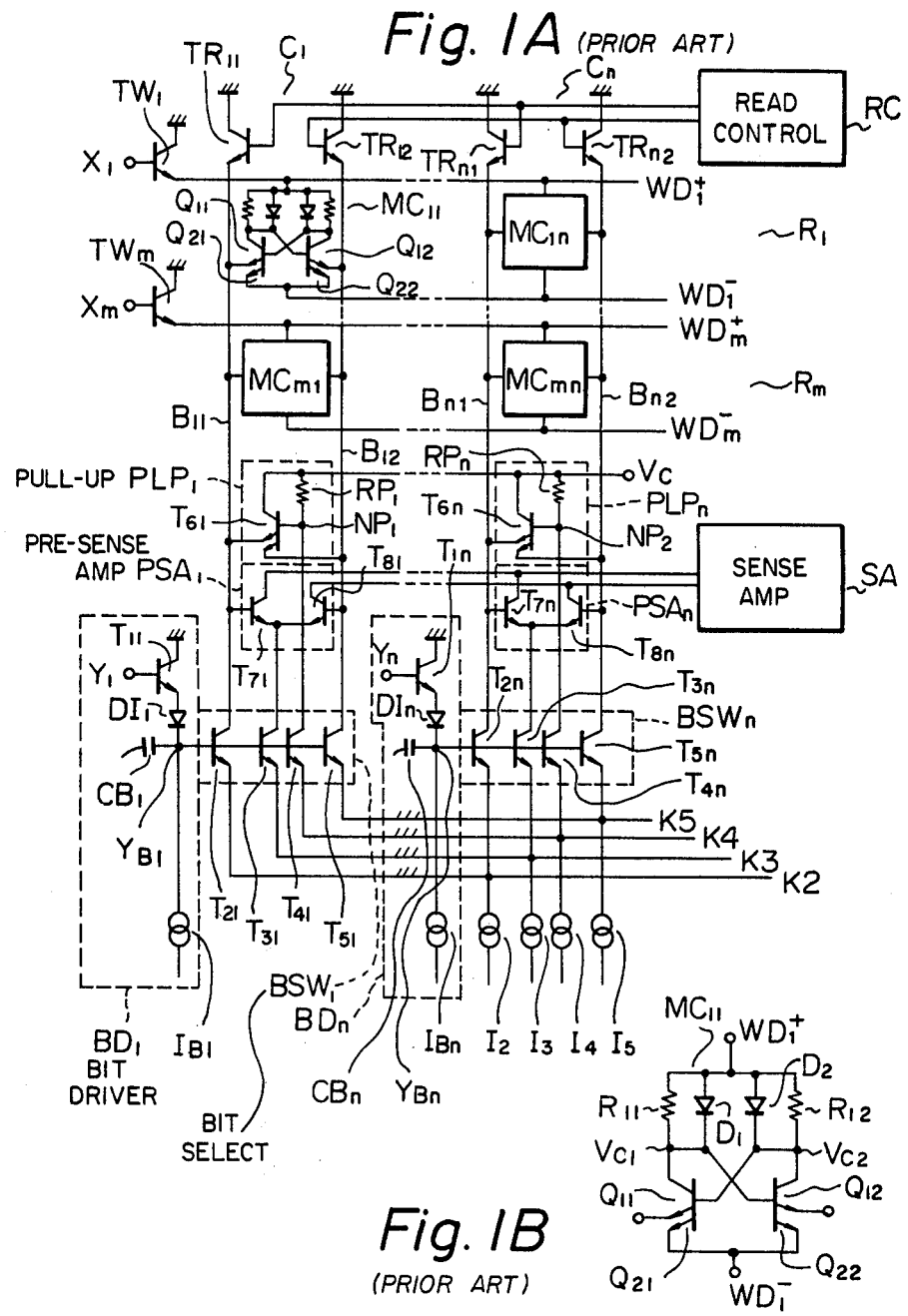
FIG. 1A is a circuit diagram of a main portion of a conventional static bipolar RAM.
FIG. 1B is a detailed circuit diagram of a memory cell in the circuit of FIG. 1A.

FIG. 3 is a circuit diagram of a static bipolar RAM, according to the present invention. The difference between FIGS. 1 and 3 is that, in FIG. 3, a discharge path $DIS_i$ is connected to the bases of the transistors $T_{2i}$ through $T_{5i}$ in the bit selection circuit $BSW_i$. The other ends of the discharge paths $DIS_1, \ldots,$ and $DIS_n$ are commonly connected through a discharge signal line KDIS to a discharge current source IDIS.

Figure 4:
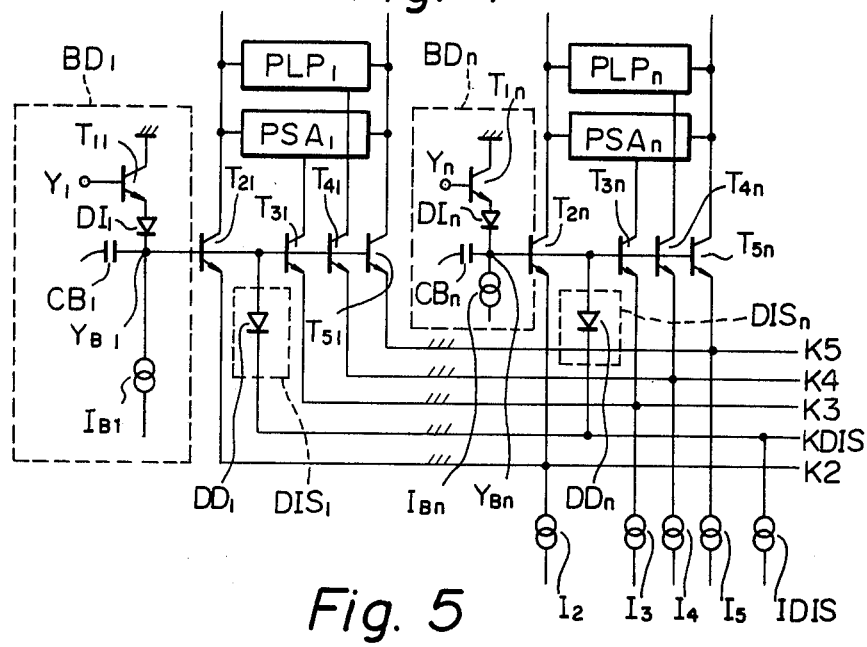
FIG. 4 is a circuit diagram of a part of the static bipolar RAM, according to an embodiment of the present invention.

FIG. 4 is a circuit diagram of a part of the static bipolar RAM, according to an embodiment of the present invention. In FIG. 4, a diode $DD_i$ is employed as a practical embodiment of each discharge path $DIS_i$. All of the diodes $DD_1, \ldots,$ and $DD_n$ and the discharge current source IDIS constitute a current switch so that only one of the diodes is turned on to conduct a discharge current IDIS. The anode potential of the conducted diode, i.e., the potential at the node $YB_i$ in the selected column, is the highest of all the anode potentials of the other diodes. Therefore, a current $IB_i + IDIS$ is conducted through the node $YB_i$ in the selected column; and only the current $IB_i$ is conducted through each node $YB_i$ in the other nonselected columns. Because of the large current $IB_i + IDIS$ in the selected bit driver circuit $BD_i$, the parasitic capacitance $CB_i$ is very rapidly discharged during the early stage of a switching when the column is switched from its selected state to the nonselected state. This causes a rapid fall of the potential at the node $YB_i$ and accordingly the potential of the bit line $B_{i1}$ when the column is switched from the selected state to the nonselected state, as illustrated by a dotted curve 2 in FIG. 2. After the dotted curve 2 crosses the rising curve 4, the column is changed to the nonselected state so that only the current $IB_i$ contributes to discharge the parasitic capacitance $CB_i$. Therefore, after that cross point, the dotted curve 2 falls as slowly as the conventional fall curve 1. As a result, the time required for obtaining the predetermined potential difference $\Delta V$ between the bit lines $B_{i1}$ and $B_{i2}$ is $T_2$ which is far shorter than the time $T_1$ in the conventional circuit of FIG. 1. Thus, high speed switching of the columns can be obtained, and, accordingly, the access time of the memory is shortened. Although the discharge current source IDIS is added, the power consumption of the memory is not significantly increased but rather is decreased in comparison with the power consumption in the conventional memory, because, in the circuit of FIG. 3, it is possible to make the current drawing capability of each current source $IB_i$ in each bit drive circuit $BD_i$ smaller than that in the circuit of FIG. 1.

Figure 5:
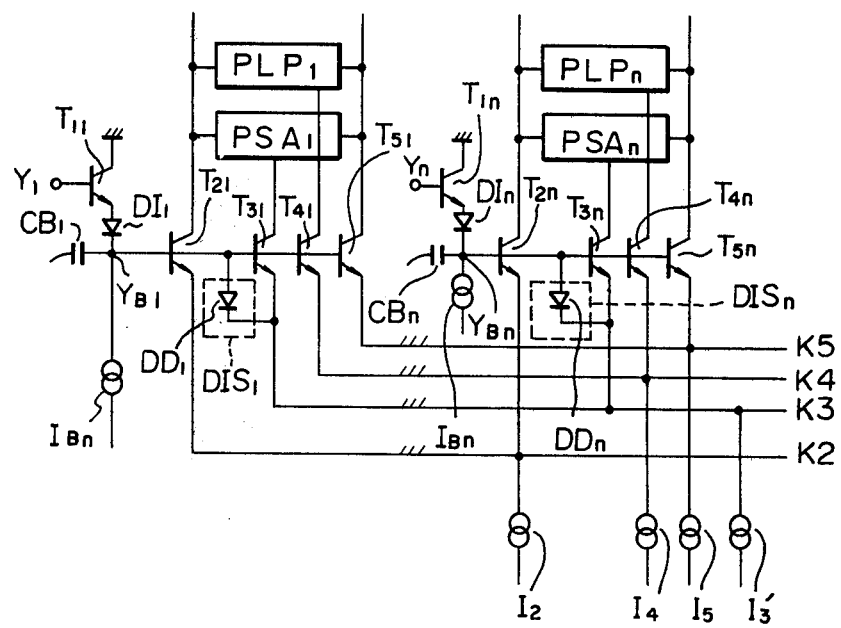
FIG. 5 is a circuit diagram of a part of the static bipolar RAM, according to another embodiment of the present invention.

FIG. 5 is a circuit diagram of a part of the static bipolar RAM, according to another embodiment of the present invention. In FIG. 5, the cathode of the diode $DD_i$ in each discharge path $DIS_i$ is connected to the signal line $K_3$ connected to the emitter of the transistor $T_{3i}$ so that the discharge signal line KDIS in FIG. 4 is eliminated. In place of the current sources $I_3$ and IDIS, a current source $I_3'$ having a value $I_3$+IDIS is connected to the signal line $K_3$. The ratio between the current $I_3$ which flows through the transistor $T_{3i}$ to the pre-sense amplifier $PSA_i$ and the current IDIS which flows through the discharge diode $DD_i$ is determined by the ratio between the areas of the transistor $T_{3i}$ and the diode $DD_i$. Therefore, the ratio of these areas is designed to have a predetermined value. The diode $DD_i$ is formed by a junction portion between the emitter and the base of a conventional transistor. In place of connecting the cathode of the diode $DD_i$ to the signal line $K_3$ in the circuit of FIG. 5, the cathode may be connected to the signal line $K_4$ connected through the transistors $T_{41}, \ldots,$ and $T_{4n}$ to the pull-up circuits $PLP_1, \ldots,$ and $PLP_n$, respectively, which serve to charge up the nonselected bit lines.

Figure 6:
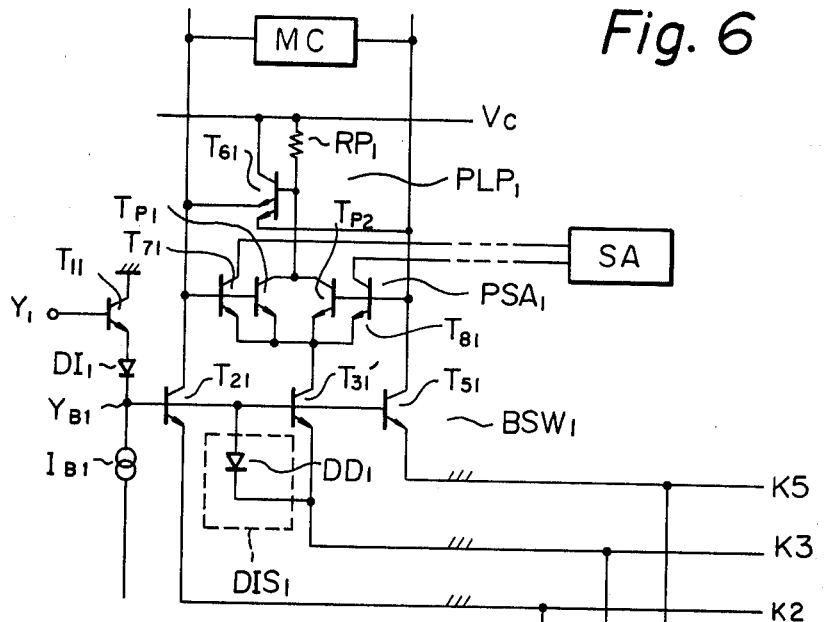
FIG. 6 is a circuit diagram of a part of the static bipolar RAM, according to still another embodiment of the present invention.

FIG. 6 is a circuit diagram of a part of a static bipolar RAM, according to still another embodiment of the present invention. In FIG. 6, the base of the transistor $T_{61}$ in the pull-up circuit $PLP_1$ is commonly connected to the collectors of transistors $T_{P1}$ and $T_{P2}$. The base and the emitter of the transistor $T_{P1}$ are connected to the base and the emitter of the transistor $T_{71}$, respectively. Also, the base and the emitter of the transistor $T_{P2}$ are connected to the base and the emitter of the transistor $T_{81}$, respectively. The emitters of the transistors $T_{71}, T_{P1}, T_{p2}$, and $T_{81}$ are commonly connected to the collector of a transistor $T_{31}'$ which takes the place of the transistors $T_{31}$ and $T_{41}$ in the circuit of FIG. 5. The emitter of the transistor $T_{31}'$ is connected through the signal line $K_3$ to a current source $I_3'$ which takes the place of the current sources $I_3$ and $I_4$ in the circuit of FIG. 4. The other columns have the same circuit configurations as the first column described above. This circuit configuration decreases the number of the transistors in each bit selection circuit $BSW_i$ to three so that the parasitic capacitance $CB_i$ due to the base capacitances of these transistors is decreased in comparison with the circuit of FIG. 5. Further, the number of signal lines $K_2$, $K_3$, and $K_5$, each of which is commonly connected to all of the bit selection circuits $BSW_1, \ldots,$ and $BSW_n$, is decreased to three. The bit line pull-up circuit $PLP_i$ receives a current from the current source $I_3'$ through the signal line $K_3$, the transistor $T_{3i}'$ and the transistor $T_{P1}$ or $T_{P2}$. The pre-sense amplifier $PSA_i$ receives a current from the current source $I_3'$ through the transistor $T_{3i}'$. The discharge diode $DD_i$ is connected between the base and the emitter of the transistor $T_{31}'$ in a manner similar to the circuit of FIG. 5.

In the foregoing embodiments, however, the discharge current IDIS is supplied to the node $YB_i$ in the column, which is switched from the selected state to the nonselected state, only in the first half switching period because the discharge current IDIS flows through a discharge path $DIS_i$ connected to the node $YB_i$ which has the highest potential. Therefore, as illustrated in FIG. 2 by the dotted curve 2, after the cross point of the falling curve 2 and the rising curve ②, the falling speed of the curve 2 is lowered, with the result that a sufficiently high speed operation cannot be realized.

In order to obtain a higher speed of operation, an additional embodiment is presented according to the present invention.

Figure 7:
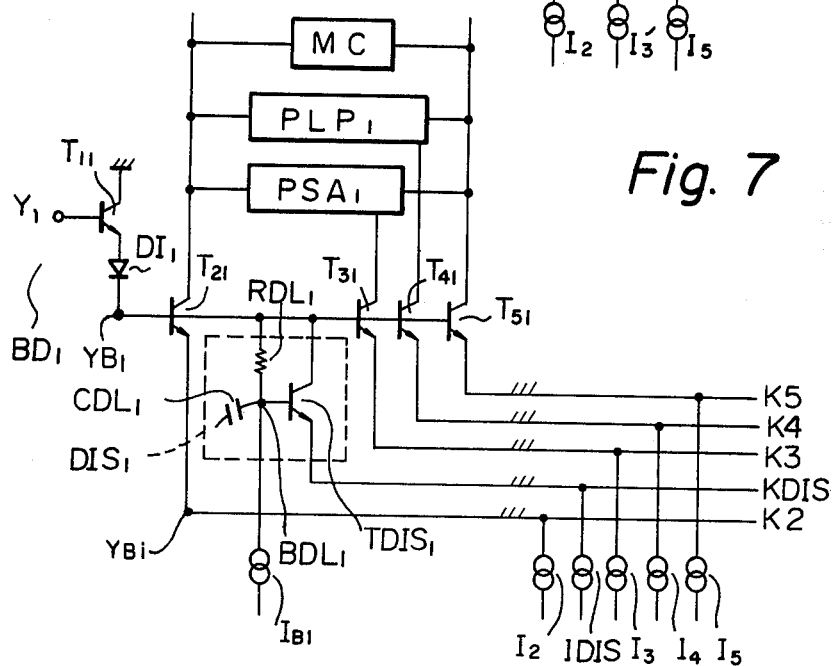
FIG. 7 is a circuit diagram of a part of the static bipolar RAM, according to still another embodiment of the present invention.

FIG. 7 is a circuit diagram of a part of a static bipolar RAM, according to the additional embodiment of the present invention. The differences between the circuit of FIG. 4 and FIG. 7 are that, in FIG. 7, each discharge path $DIS_i$ comprises a transistor $TDIS_i$ having a collector connected to the node $YB_i$ and a base connected through a resistor $RDL_i$ to the node $YB_i$. A delay capacitor $CDL_i$ is connected to the base of the transistor $TDIS_i$. The emitter of the transistor $TDIS_i$ is connected through the signal line KDIS to the current source IDIS. In each bit drive circuit $BD_i$, the current source $IB_i$ is eliminated. When a column is switched from the selected state to the nonselected state, the charge on the node $YB_i$ in that column is discharged through the transistor $TDIS_i$ in that column so that the potential at the node $YB_i$ is lowered. However, the fall of the base potential $BDL_i$ of the transistor $TDIS_i$ in that column is delayed in comparison with the fall of the potential at the node $YB_i$ due to a time constant derived from the resistor $RDL_i$ and the capacitor $CDL_i$. Therefore, the transistor $TDIS_i$ in that column continues to discharge after the potential at the node $YB_i$ is sufficiently lowered. On the other hand, when another column is switched from the nonselected state to the selected state, the rise of the base potential $BDL_i$ of the transistor $TDIS_i$ in this column is also delayed in comparison with the rise of the potential at the node $YB_i$ due to the time constant derived from the resistor $RDL_i$ and the capacitor $CDL_i$. Therefore, the transistor $TDIS_i$ in this column is kept cut-off after the potential at the node $YB_i$ in that column sufficiently rises. Thus, as illustrated in FIG. 2 by a dash dot curve 3, the falling curve 3 falls more rapidly than the curve 2 because the discharge current IDIS flows through the discharge path even after the falling curve 3 crosses with the rising curve ②. As a result, the time required for obtaining the predetermined difference between the bit lines $B_{i1}$ and $B_{i2}$ is $T_3$, which is the shortest of all the embodiments.

From the foregoing description, it will be apparent that, the present invention enables the fabrication of a static semiconductor memory device, having a large memory capacity, in which the power consumption is decreased and high speed column switching is realized.

It should be noted that the present invention is not restricted to the foregoing embodiments, but various changes and modifications are possible without departing from the essential spirit of the invention. For example, although the column selection signal changes from the high potential to the low potential when the column is switched from the selected state to the nonselected state, the present invention may also be applied to the case where the column selection signal changes from the low potential to the high potential when the column is switched from the selected state to the nonselected state.

We claim:

1. A static semiconductor memory device, operatively connected to receive column selection signals, comprising:

a plurality of memory cells arranged in a matrix having columns and rows, each of said plurality of memory cells comprising two driving transistors connected in intersection;

a plurality of word lines connected to said plurality of memory cells and arranged in the row direction;

a plurality of bit lines connected to said plurality of memory cells and arranged in the column direction, each bit line connectable to receive a current for reading information stored in or for writing information to be stored in said plurality of memory cells;

a common current source;

a plurality of bit selection circuits operatively connected to said common current source and operatively connected to respective ones of said columns of said matrix, each of said plurality of bit selection circuits operatively connected to receive a corresponding one of said column selection signals having a first reference potential, when the corresponding column is selected, and to supply a current from said common current source to said corresponding selected column;

a plurality of bit driver circuits respectively, operatively connected to said columns of said matrix, each of said plurality of bit driver circuits connected to cause said column selection signal to have said first reference potential when the corresponding column is selected;

a discharge current source; and means forming a plurality of discharge paths, each of said discharge paths being connected between a respective one of said plurality of bit selection circuits and said discharge current source, for functioning so that when a column in said matrix is switched from a selected state to a nonselected state, the potential of the corresponding column selection signal is changed to a second potential through said discharge path.

2. A static semiconductor memory device as set forth in claim 1, wherein each of said plurality of bit selection circuits comprises a transistor having an emitter connected to said common current source, having a base connected to receive a corresponding one of the column selection signals, and having a collector connected to the corresponding column of said matrix, wherein the transistors in said plurality of bit selection circuits form a current switch, and wherein one end of each of said plurality of discharge paths is connected to said base of said transistor in the corresponding one of said plurality of bit selection circuits.

3. A static semiconductor memory device as set forth in claim 2, wherein each of said plurality of discharge paths comprises a discharge diode having an anode connected to said base of the transistor in the corresponding one of said plurality of bit selection circuits and a cathode connected to said discharge current source.

4. A static semiconductor memory device as set forth in claim 3, wherein said common current source and said discharge current source are formed by a single current source, and wherein said cathode of said discharge diode is connected to said single current source.

5. A static semiconductor memory device as set forth in claim 4, wherein each of said columns in said matrix comprises:

a pull-up circuit, operatively connected to a pair of said plurality of bit lines, for charging up the nonselected bit lines; and a pre-sense amplifier, operatively connected to said pair of said plurality of bit lines, for amplifying the potential difference between said pair of bit lines, wherein said pre-sense amplifier comprises a current switch connected between the collector of said transistor in each of said plurality of bit selection circuits and said pull-up circuit.

6. A static semiconductor memory device as set forth in claim 2, wherein each of said plurality of discharge paths comprises:

a delay circuit; and a discharge transistor having a collector connected to said base of the transistor in the corresponding one of said plurality of bit selection circuits, having an emitter connected to said discharge current source, and having a base connected to receive said corresponding one of the column selection signals through said delay circuit.

* * * * *

UNITED STATES PATENT AND TRADEMARK OFFICE
CERTIFICATE OF CORRECTION

PATENT NO. : 4,417,326

DATED : NOVEMBER 22, 1983

INVENTOR(S) : KAZUHIRO TOYODA ET AL.

It is certified that error appears in the above-identified patent and that said Letters Patent is hereby corrected as shown below:

Col. 1, line 48, "$WD_1+$" should be --$WD_1^+$--;

line 51, "$WD_1+$" should be --$WD_1^+$--;

line 59, "$WD_1+$" should be --$WD_1^+$--; and

"$WD_m+$" should be --$WD_m^+$--;

line 66, "$WD_1-$" should be --$WD_1^-$--; and

"$WD_m-$" should be --$WD_m^-$--.

Col. 2, line 19, "$T_{7m}$" should be --$T_{71}$--; and

"$T_{8m}$" should be --$T_{81}$--; and

"$Q7n$" should be --$T_{7n}$--; and

"$Q8n$" should be --$T_{8n}$--.

UNITED STATES PATENT AND TRADEMARK OFFICE
CERTIFICATE OF CORRECTION

PATENT NO. : 4,417,326

DATED : NOVEMBER 22, 1983

INVENTOR(S) : KAZUHIRO TOYODA ET AL.

Page 2 of 2

It is certified that error appears in the above-identified patent and that said Letters Patent is hereby corrected as shown below:

Col. 3, line 29, "$WD_1+$" should be --$WD_1^+$--;

line 30, "$WD_1+$" should be --$WD_1^+$--;

line 54, "$WD_1+$" should be --$WD_1^+$--.

Col. 8, line 37, "When" should start a new paragraph.

Signed and Sealed this

Eighth Day of May 1984

[SEAL]

Attest:

GERALD J. MOSSINGHOFF

Attesting Officer

Commissioner of Patents and Trademarks